Nov. 2, 1965 J. V. WERME 3,216,006

ANALOG TO DIGITAL CONVERTER

Filed June 14, 1962 5 Sheets-Sheet 1

INVENTOR.

JOHN V. WERME

BY

John F. Lehrs

ATTORNEY

ANALOG TO DIGITAL CONVERTER

Filed June 14, 1962

INVENTOR.
JOHN V. WERME
BY
John F. Lukas
ATTORNEY

Nov. 2, 1965 J. V. WERME 3,216,006

ANALOG TO DIGITAL CONVERTER

Filed June 14, 1962 5 Sheets-Sheet 3

INVENTOR.
JOHN V. WERME
BY John F. Lahres
ATTORNEY

Nov. 2, 1965 J. V. WERME 3,216,006

ANALOG TO DIGITAL CONVERTER

Filed June 14, 1962

5 Sheets-Sheet 4

INVENTOR.
JOHN V. WERME

BY John F. Luhrs

ATTORNEY

Nov. 2, 1965 J. V. WERME 3,216,006

ANALOG TO DIGITAL CONVERTER

Filed June 14, 1962 5 Sheets-Sheet 5

INVENTOR.
JOHN V. WERME

BY John F. Lahns
ATTORNEY

United States Patent Office 3,216,006
Patented Nov. 2, 1965

3,216,006
ANALOG TO DIGITAL CONVERTER
John V. Werme, Painesville, Ohio, assignor to Bailey Meter Company, a corporation of Delaware
Filed June 14, 1962, Ser. No. 202,570
12 Claims. (Cl. 340—347)

This invention relates to signal converting apparatus and more particularly to an improved analog to digital signal converter.

Many commercially available devices are capable of accurately converting an analog signal to a digital signal. While these available converting devices perform their intended purposes, they possess operational limitations which result in less than optimum performance and lack of flexibility. One such limitation is the inability of most converters to digitize both A.-C. and D.-C. analog signals and the peak value of D.-C. signals containing a proportional A.-C. ripple. Another such limitation is the inability of most converters to digitize an increasing analog input signal until the input stabilizes at its maximum value.

It is a principal object of this invention to provide an improved analog to digital converter.

Another object of the invention is to provide an improved analog to digital converter which can digitize an increasing analog signal.

A further object of the invention is to provide an analog to digital converter which can digitize an alternating analog signal or a D.-C. analog signal containing a proportional A.-C. ripple.

In the preferred embodiment of the invention an input signal to be digitized is applied to a null detector and compared with a feedback signal representative of the digital output of the converter. The null detector controls operation of an electrical oscillator to effect generation of electrical pulses when the input signal exceeds the feedback signal. A counting circuit is responsive to the oscillator pulses to establish the digital output signal. Means are provided for setting the digital output signal to a predetermined magnitude at the start of a signal conversion and for initially incrementing the magnitude of the digital output signal by a predetermined amount in response to each oscillator pulse. After a predetermined time an increment equal to the initial magnitude of the digital output signal is subtracted from the digital output signal, and the digital output signal is thereafter incremented by a smaller amount in response to each oscillator pulse until the signal conversion is complete.

Other objects and advantages will become apparent from the following description taken in connection with the accompanying drawings wherein.

Figure 1:
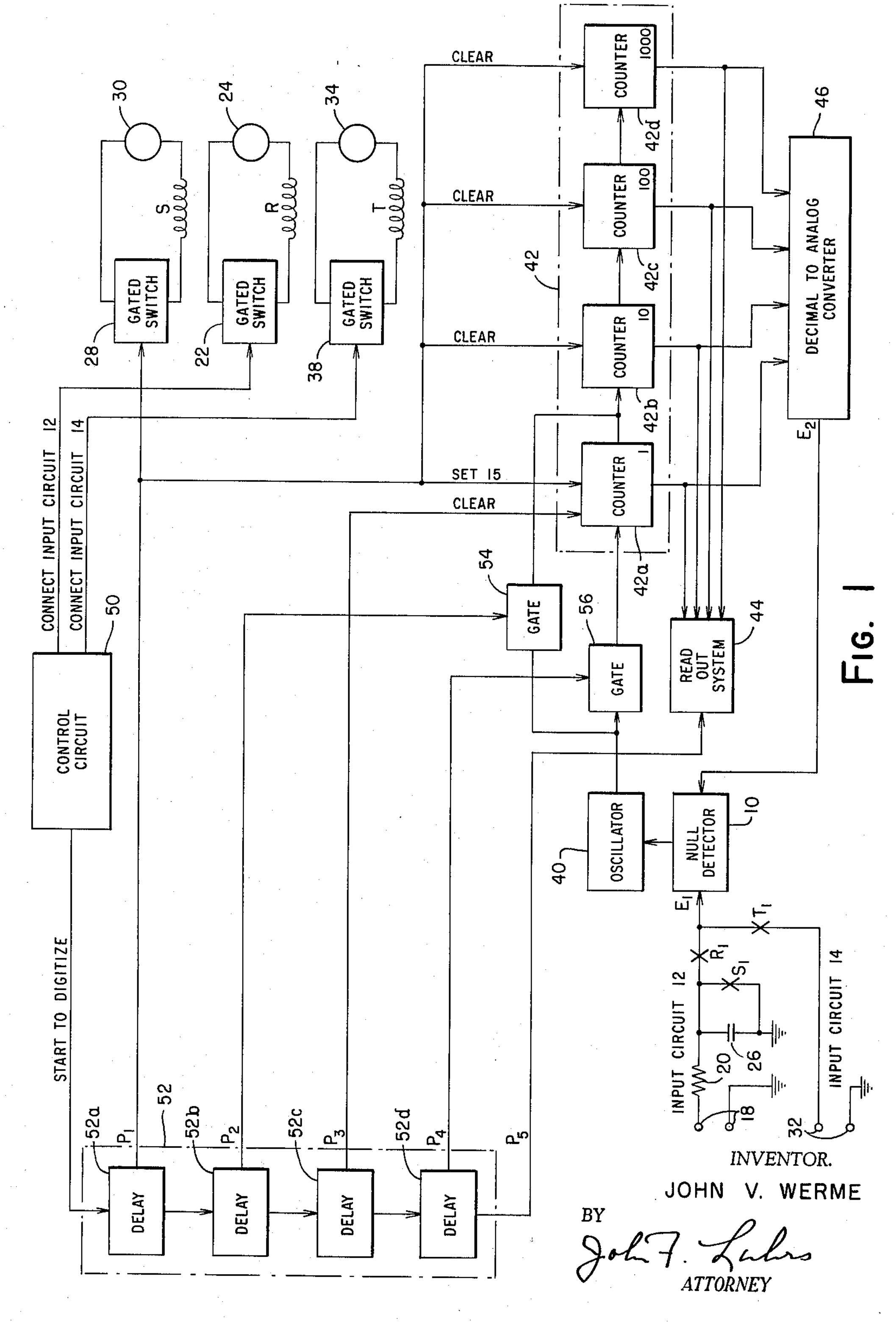
FIG. 1 is a schematic illustration in functional block diagram of an analog to digital converter embodying the invention.

*FIG. 1 embodiment*

Referring to FIG. 1 of the drawings, the analog to digital converter comprises in general a null detector 10 having an input circuit 12 for D.-C. analog signals subject to transient conditions and an input circuit 14 for A.-C. and D.-C. analog signals which are not subject to transient conditions. The input circuits 12 and 14 may be selectively connected to the null detector 10 to effect conversion of either an A.-C. or D.-C. analog input signal to a proportional digital output signal.

Input circuit 12 comprises a pair of input terminals 18 to which a D.-C. signal to be digitized is applied, one of said terminals being connected to ground and the other connected in series with an input resistance 20, contacts $R_1$ of a relay R, and one input of null detector 10. Energization of relay coil R is controlled by a gated switch 22 connected in series with a power source 24. A capacitance 26 forming an R-C input time delay circuit with resistance 20 is connected between the junction of resistance 20 and contacts $R_1$, and ground. Contacts $S_1$ of relay S are connected in a shunt circuit with capacitance 26 to enable the same to be discharged to ground. Energization of relay coil S is controlled by a gated switch 28 cooperative with a power source 30.

At the start of a signal conversion relay coil S is energized to momentarily close contacts $S_1$ to short the input signal to ground and discharge capacitance 26. The input signal $E_1$ to null detector 10 will then increase exponentially from zero to the maximum value thereof in a predetermined time dependent on the charging time constant of the R-C circuit. The time delay required for increase of input signal $E_1$ to its maximum value is preferably such that any temporary transient condition affecting the magnitude of the D.-C. signal applied to terminals 18 will disappear or stabilize before $E_1$ reaches its maximum value so that the digital output signal of the converter will not reflect an error in the input signal caused by a transient condition. Such a transient condition may be the result of, for example, the use of a single amplifier in a high-speed scanning system.

The input circuit 14 comprises a pair of input terminals 32 one of which is grounded and the other of which is adapted to be connected to the input of null detector 10 by contacts $T_1$ of a relay T, connected in series with a power source 34 and a gated switch 38. As previously mentioned circuit 14 may be utilized as an input circuit for A.-C. signals and also D.-C. signals which are not subject to transient conditions.

It will be apparent that through selective energization of relay coils R and T through the selective application of control pulses to gated switches 22 and 38 respectively, selective connection of input circuits 12 and 14 to null detector 10 can be achieved.

Null detector 10 may take various forms well known to those skilled in the art and may function, for example, to produce a binary logic one output when the feedback signal $E_2$ equals or exceeds the input signal $E_1$ and to produce a binary logic zero output when the input signal $E_1$ exceeds the feedback signal $E_2$. Apparatus responsive to and for establishing such logic signals is well known to those skilled in the art and further description is deemed unnecessary.

An oscillator circuit 40 function in response to a binary logic zero output of null detector 10 to generate electrical pulses at a predetermined frequency. At the null condition where $E_2$ equals $E_1$ the logic one output of null dectector 10 will render oscillator 40 inoperative and the generation of electrical pulses will cease.

The electrical pulses generated by oscillator circuit 40 are variously applied to a digital counting circuit 42 comprising counters 42*a*, 42*b*, 42*c* and 42*d* which count the input oscillator or carry pulses to the base 1, 10, 100 and 1000 respectively. The counters 42*a*, 42*b*, 42*c* and 42*d* may comprise one of several commercially available types such as, for example, the type having a binary coded decimal output in the form of pulse combinations. For a complete description of various counter and null detector circuits reference is made to the next entitled, "Digital Computer Components and Circuits" by R. K. Richards, Library of Congress Catalog Card No. 57-13454. As is well known to those skilled in the art such counters may be arranged to reset and produce a carry pulse on the tenth input count and may be provided with an input circuit operative in response to a signal pulse to set the counter output to a predetermined value. In FIG. 1 each of the counter outputs is functionally represented by a single data line.

A read-out system 44 adapted to be rendered operative and inoperative by the application of control pulses thereto is provided for reading the output pulse combinations of counters 42*a*, 42*b*, 42*c* and 42*d*. As will later be described, at the end of a signal conversion a control pulse is applied to read-out system 44 to render the same operative.

The digital output of counting circuit 42 is also applied to a decimal to analog converter 46 which functions to convert the binary decimal output of counting circuit 42 to an analog signal to establish the analog feedback signal $E_2$. As the digital output of counting circuit 42 is incrementally increased by output pulses from oscillator 40, the feedback signal $E_2$ will undergo a similar proportional analog increase in magnitude. For purposes of illustration only, the counters 42*a*, 42*b*, 42*c* and 42*d* may be arranged to increment the digital output signal of counting circuit 42 and the analog signal $E_2$ by 1, 10, 100 and 1000 millivolts respectively in response to each input oscillator or carry pulse applied thereto.

The system thus far described functions in response to input signal $E_1$ to effect generation of electrical pulses by oscillator 16 until the feedback signal $E_2$ equals the input signal $E_1$. When this null condition is sensed by null dectector 10 the operation of oscillator 40 will cease.

A control circuit 50 which may form part of a complete data system or represent such a data system is illustrated for controlling gated switches 22 and 38 to permit selective energization of relay coils R and T and thus selective connection of input circuits 12 and 14 to null detector 10 depending on the type of analog signal to be digitized. Control circuit 50 thus functionally represents any suitable system for effecting as desired connection of either input circuit to the null detector 10 depending on the type of analog signal to be converted and represents a system for initiating a signal conversion.

Control circuit 50 in addition to controlling gated switches 22 and 38 also functions to commence a conversion operation by initiating operation of a time delay means 52 comprising a plurality (in this case four) sequentially operative delay circuits 52*a*, 52*b*, 52*c* and 52*d*. At the start of a conversion operation the control circuit 50 establishes an input control pulse to time delay means 52. In their alphabetical sequence according to a predetermined time schedule delay circuits 52*a*, 52*b*, 52*c* and 52*d* function in a manner well known to those skilled in the art to establish sequential time spaced output control pulses or signals $P_1$, $P_2$, $P_3$, $P_4$, and $P_5$, as indicated schematically. These pulses are utilized to control the system functions during a signal conversion.

At the beginning of a signal conversion, pulse $P_1$ generated by delay circuit 52*a* is transmitted to gated switch 28 to effect momentary energization of relay coil S, transmitted to counter 42*a* to set the digital output signal thereof to a predetermined magnitude, and transmitted to counters 42*b*, 42*c* and 42*d* to clear the same to zero. In general the output pulses of oscillator 40 are applied to the input of counter 42*b* during an initial time period of the conversion time period and then to the input of counter 42*a* during the remainder of the conversion time period to accomplish incrementation of the digital output signal by two different magnitudes. To this end oscillator output pulses are initially transmitted through a gate 54, adapted to be rendered conductive by pulse $P_2$, to the input of counter 42*b*. The oscillator output pulses are subsequently transmitted through a gate 56, adapted to be rendered conductive by the existence of pulse $P_4$, to the input of counter 42*a*.

During a signal conversion pulse $P_2$ is produced by delay circuit 52*b* a predetermined time increment after the occurrence of pulse $P_1$ to effect application of the oscillator output pulses to the input of counter 42*b* resulting in an incremental increase of the digital output signal by 10 millivolts in response to each oscillator pulse. This permits the digital output signal to increase at a high rate to follow an increasing analog input signal $E_1$. After a predetermined time delay pulse $P_2$ is terminated and pulse $P_3$ is established and rendered effective to clear the output of counter 42*a* to zero to substract an increment from the digital output signal equal to the initial magnitude set by pulse $P_1$. After a predetermined time increment necessary to clear the output of counter 42, signal $P_4$ is established to render gate 56 conductive to apply the oscillator output pulses to the input of counter 42*a* to effect a one millivolt incrementation of the digital output signal in response to each oscillator pulse. At the end of the selected signal conversion time pulse $P_5$ is established to render read-out system 44 operative to read the digital output of counting circuit means 42. It will be apparent to those skilled in the art that the counting circuit 42 may also include a gate circuit (not shown) between the counters 42*a* and 42*b* responsive to pulse $P_4$ to permit the transmission of a carry pulse from counter 42*a* to counter 42*b* only during the existence of pulse $P_4$.

Referring now to the operation of the system illustrated in FIG. 1 assume that it is desired to convert a direct voltage analog signal having a magnitude of 125 millivolts and which is subject to transient conditions requiring the use of input circuit 12. Assume that 200 milliseconds is the maximum time permitted for signal conversion and that the R-C time delay of input circuit 12 introduces a time delay of 100 milliseconds thus causing the signal $E_1$ to increase exponentially from zero to its maximum value of 125 millivolts in 100 milliseconds.

Figure 2:
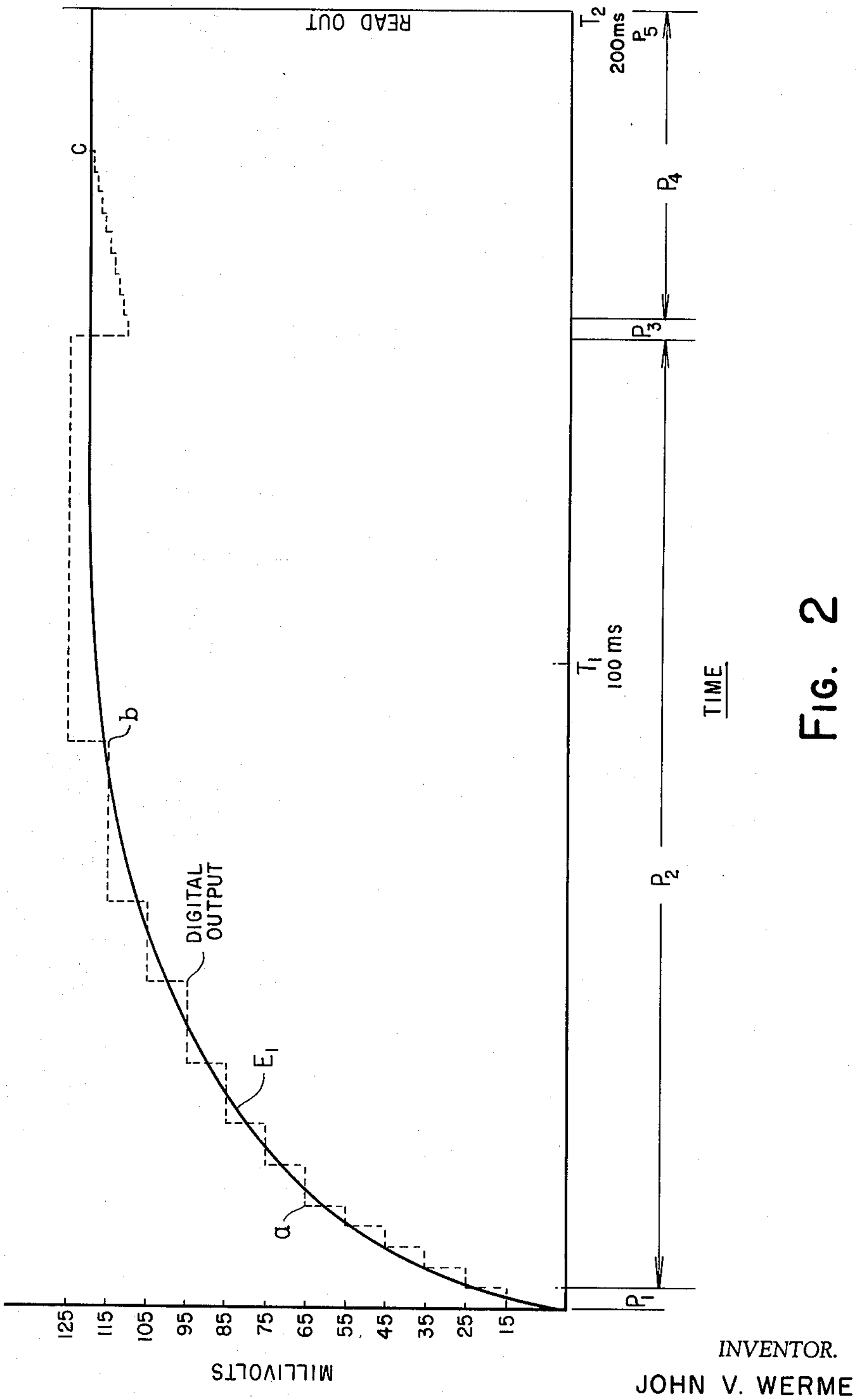
FIGS. 2 and 3 are curves illustrating the operation of the converter illustrated in FIG. 1.

In FIG. 2 I have represented by the solid line the exponential increase of the signal $E_1$ from zero to its maximum value following a momentary closure of contacts $S_1$ to short the input to ground. The digital output signal of counting circuit 42 is represented by the dashed line. The time occurrence and duration of pulses $P_1$, $P_2$, $P_3$, $P_4$ and $P_5$ is indicated along the abscissa. At the time $T_1$ (100 milliseconds) the signal $E_1$ reaches its maximum value of 125 millivolts and at time $T_2$ (200 milliseconds) it is desired that the signal conversion be complete and read-out of the digital output signal of counting circuit 42 occur.

To initiate a signal conversion control circuit 50 functions to apply a control pulse to gated switch 22 to effect connection of input circuit 12 to the input of null detector 10 and functions to apply a control pulse to time delay means 52 to initiate the sequential generation of pulses $P_1$, $P_2$, $P_3$, $P_4$ and $P_5$. Pulse $P_1$ is first established by time delay circuit 52*a* and is effective to clear the output of counters 42*b*, 42*c* and 42*d* and set the output of counter 42*a* to 15 millivolts and effective to close gated switch 28 and energize relay coil S to effect closure of contacts $S_1$ to momentarily short the direct voltage input applied to terminals 18 to ground. Upon opening of contacts $S_1$ signal $E_1$ will commence to increase exponentially to 125 millivolts as illustrated in FIG. 2.

The 15 millivolt of counter 42*a* is converted to an analog signal of 15 millivolts in converter 46 and compared with the signal $E_1$ in null detector 10. As the signal $E_1$ starts to increase exponentially it will exceed the initial 15 millivolt magnitude of signal $E_2$ causing the null detector 10 to establish a logic zero output to effect generation of pulses by oscillator 40.

As illustrated by FIG. 2, a small time increment after the occurrence of pulse $P_1$, pulse $P_2$ is established to open gate 54 to apply the oscillator output pulses to the input of counter 42*b*. Pulse $P_2$ will exist until pulse $P_3$ is subsequently established and during this time period each oscillator pulse will increment the digital output of counter 42 by 10 millivolts and effect a corresponding increase in the magnitude of analog feedback signal $E_2$.

During the initial increase of signal $E_1$ in the steeper portion of the curve, the signal $E_1$ will tend to exceed the feedback signal $E_2$ and as illustrated by the curves of FIG. 2 the digital output signal will increase continuously in 10 millivolt increments to substantially follow the signal $E_1$ in magnitude. As the slope of $E_1$ tends to decrease substantially for example at point *a* a 10 millivolt increase of the digital output signal may cause the feedback signal $E_2$ to momentarily exceed $E_1$ in magnitude to temporarily turn off oscillator 40. At this condition the generation of pulses will cease until the signal $E_1$ increases further and again exceeds $E_2$ in magnitude.

As the slope of the $E_1$ curve further decreases the occurrences and time duration of the oscillator "off" periods will further increase. At point *b* the last oscillator pulse will occur just prior to the time the signal $E_1$ reaches its maximum value. The last oscillator pulse in the example condition being considered causes the resulting 10 millivolt increment to increase the digital output signal and feedback signal $E_2$ above the maximum value of $E_1$ by approximately 5 millivolts. This condition will exist until pulse $P_3$ is established by time delay means 52.

Pulse $P_3$ is effective to clear the output of counter **42*a* to effect subtraction of a 15 millivolt increment from the digital output of counter 42**. As a result the digital output signal will momentarily decrease by 15 millivolts to cause the signal $E_1$ to exceed the same in magnitude by approximately 10 millivolts.

A short time increment after the occurrence of pulse $P_3$, pulse $P_4$ will be established to open gate 56 to apply the oscillator pulses to the input of counter **42*a*. During the existence of pulse $P_4$ each oscillator pulse will be effective to increment the digital output of counting circuit 42** by one millivolt. Thus, while $E_1$ exceeds $E_2$ in magnitude, the digital output signal will increase in 1 millivolt increments as shown in FIG. 2 until the digital output signal and signal $E_2$ equals the signal $E_1$ at point *c*. When the null detector 10 senses the equality of signal $E_1$ and signal $E_2$ the oscillator 40 will be turned off and the signal conversion will be complete.

At the end of the signal conversion time pulse $P_4$ will be terminated and pulse $P_5$ will be established to effect read out of the digital output of counting circuit 42 by read-out system 44.

The system of FIG. 1 is particularly adapted for use in a data system where a particular time period is available for a signal conversion such as the 200 millisecond time period considered in the above example. Pulses $P_1$, $P_2$, $P_3$, $P_4$ and $P_5$ are thus generated on a time basis to achieve conversion of an exponentially increasing input signal $E_1$ in the time permitted. It will be apparent, however, that these pulses may be varied in time spacing to facilitate conversion of signals which increase in accordance with a different mathematical function or to effect conversion of an A.-C. analog signal as will later be described.

The initial setting of the digital output signal to a predetermined magnitude and the subsequent subtraction of an equal increment provides a unique result in that the digital output signal can be permitted to exceed the input signal $E_1$ during an initial time period without affecting the accuracy of the signal conversion. For example, in the operation exemplified by FIG. 2 the most the digital output can exceed the signal $E_1$ at the instant pulse $P_3$ is established is 10 millivolts. However, the subtraction of a 15 millivolt increment at the end of the time period permits a subsequent increase of the digital output signal in 1 millivolt increments to the magnitude of the signal $E_1$.

Figure 3:
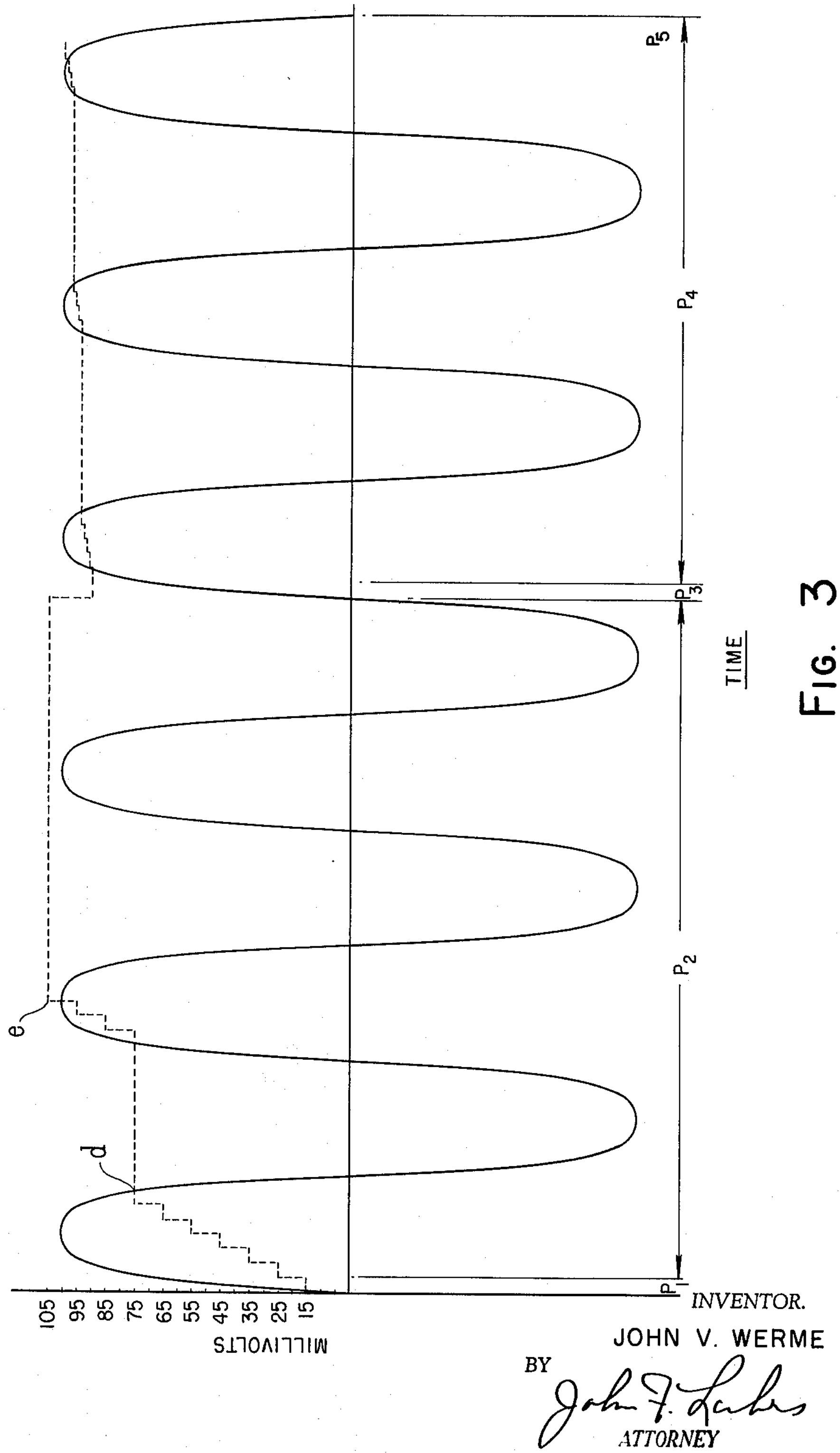

Referring now to the operation of the system in converting an A.-C. analog signal to digital form, reference is made to FIG. 3 which depicts an alternating signal having a peak magnitude of 100 millivolts. In general the system functions during a positive half cycle of the A.-C. signal as described in connection with the D.-C. signal, the oscillator 40 functioning to generate pulses as long as the A.-C. input $E_1$ exceeds the feedback signal during each positive half cycle.

In the case of the A.-C. input signal, circuit 14 is utilized and control circuit 50 functions to apply a control pulse to gated switch 38 to effect connection of input circuit 14 to null detector 10 and functions to apply a control pulse to time delay means 52. Upon occurrence of pulse $P_1$ counter **42*a* is set to an output of 15 millivolts and counters 42*b*, 42*c* and 42*d*** are cleared.

Upon the occurrence of pulse $P_2$ gate 54 is opened to apply the oscillator output pulses to the input of counter **42*b***. During part of the first positive half cycle of the A.-C. signal the instantaneous magnitude of the A.-C. signal will exceed the feedback signal $E_2$ thus causing the digital output signal to increase in 10 millivolt increments as shown in FIG. 3 until the curve representing $E_1$ intersects with the curve representing the digital output signal at point *d*. The oscillator 40 will then be turned off until the next positive half cycle and until the instantaneous magnitude of input signal $E_1$ again exceeds the feedback signal $E_2$ in the second half cycle. Operation of oscillator 40 and incremental increase of the digital output signal will thus occur during that portion of each half cycle when the instantaneous magnitude of the A.-C. signal exceeds the feedback signal $E_2$ until the digital output signal exceeds the peak magnitude of the A.-C. signal at point *e*.

At the end of the time period of pulse $P_2$ pulse $P_3$ will be established to clear the output of counter **42*a* to zero to effect subtraction of a 15 millivolt increment from the digital output signal as indicated on FIG. 3. Pulse $P_4$ will be subsequently established to open gate 56 to apply the oscillator pulses to the input of counter 42*a*. The system then operates as illustrated in FIG. 3 to effect increase of the digital output signal in 1 millivolt increments during successive positive half cycles of the A.-C. signal until the digital output signal equals the peak magnitude of the A.-C. signal. At the end of the signal conversion time, pulse $P_5$ is generated to effect read-out operation of read-out system 44**.

It will thus be apparent that the system illustrated in FIG. 1 is capable of digitizing direct voltage signals or A.-C. signals. The system will digitize direct voltage signals containing an A.-C. ripple or component in the same manner as an A.-C. signal. It will also be apparent that a direct voltage signal not subject to a transient condition can be applied directly to input circuit 14.

The converter disclosed in FIG. 1 possesses the advantage of permitting a signal conversion to be commenced while the input signal is increasing without waiting for signal stabilization at a peak magnitude thus reducing the time required for a signal conversion.

Figure 4:
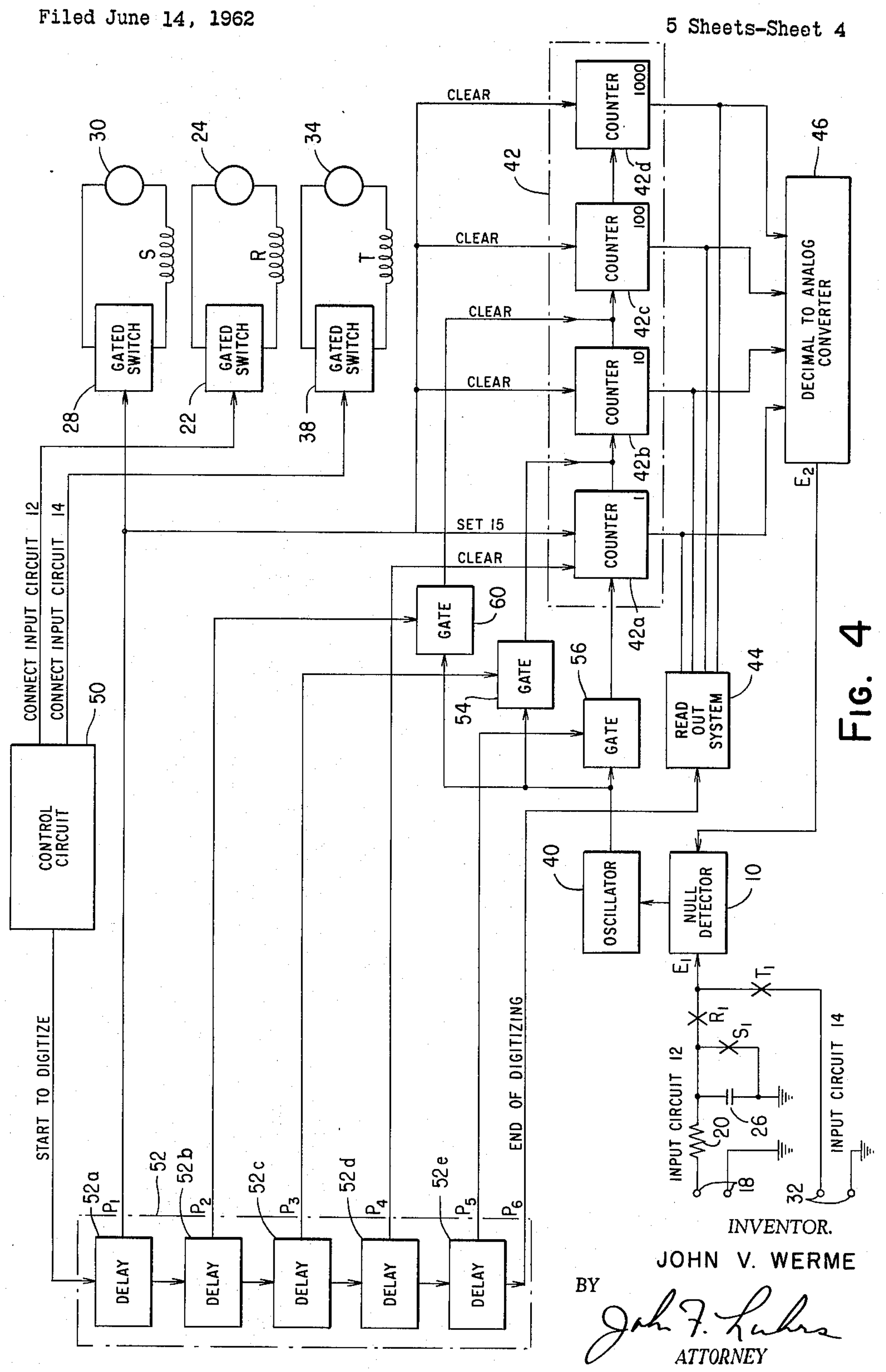
FIG. 4 is a schematic illustration in functional block diagram of another embodiment of the invention.

*FIG. 4 embodiment*

In FIG. 4 I have illustrated another embodiment of the invention wherein components similar to those shown in FIG. 1 have been given like reference numerals.

The system of FIG. 4 differs from that of FIG. 1 by the provision of a time delay means 52 having five time delay circuits **52*a*, 52*b*, 52*c*, 52*d* and 52*e***, for producing six time spaced pulses $P_1$, $P_2$, $P_3$, $P_4$, $P_5$ and $P_6$ in the permissible signal conversion time period which may for example be 200 milliseconds as discussed in connection with FIGS. 1 and 2.

Means are provided in the embodiment of FIG. 4 to effect increase of the digital output signal by increments of 3 different magnitudes to achieve a minimum conversion time for signals of high magnitudes or signals which increase at a fast rate. To this end, the pulse $P_2$ is applied to a gate 60 to initially apply the oscillator output pulses to the input of counter **42*c* and to effect increase of the digital output signal in 100 millivolt increments. Pulse $P_2$ is established during an initial time period of the conversion time to effect a rapid incremental increase of the digital output signal and is subsequently terminated upon establishment of pulse $P_3$. Upon termination of pulse $P_2$, pulse $P_3$ is established to open gate 54 to apply the oscillator pulses to the input of counter 42***b* to effect increase of the digital output signal in 10 millivolt increments similar to the system of FIG. 1. Pulse $P_4$ is subsequently established to clear counter 42*a* to usbtract the 15 millivolt increment initially set by pulse $P_1$, and pulse $P_5$ is subsequently established to effect one millivolt incrementation of the digital output signal until the digital output equals the maximum value of the signal being converted. Pulse $P_6$ is subsequently established to render read-out system 44 operative.

The system of FIG. 4 thus operates similar to system of FIG. 2 with the additional provision of means for initially increasing the digital output signal at a high incremental rate to produce minimum conversion time for particular types of signals. It will be apparent that time schedule of occurrence of pulses $P_1$, $P_2$, $P_3$, $P_4$, $P_5$ and $P_6$ may be suitably varied to accommodate particular types of signal inputs.

Figure 5:
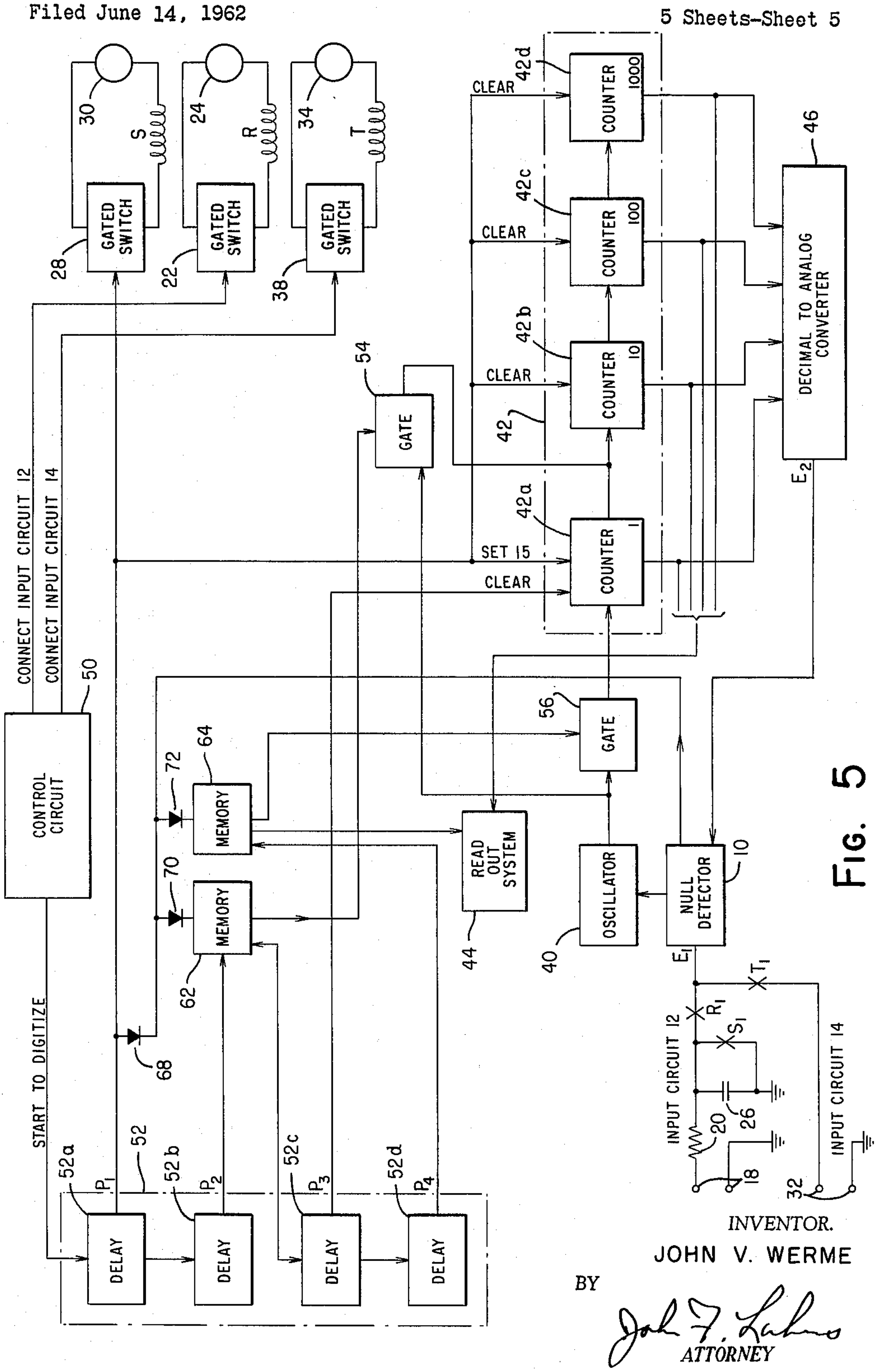
FIG. 5 is a schematic illustration in functional block diagram illustrating still another embodiment of the invention.

*FIG. 5 embodiment*

In the embodiments of FIGS. 1 and 4 increments of different magnitudes are established on a time basis to cause a digital output signal to follow an increasing input signal $E_1$.

FIG. 5 illustrates a system wherein the magnitude of the digital increment is determined by the magnitude of the signal $E_1$ being converted relative to the feedback signal $E_2$. For purposes of clarity parts in FIG. 5 similar to those in FIG. 1 have been given like reference numerals or letters.

Referring specifically to the system of FIG. 5, the control circuit 50 functions as described in connection with FIG. 1 to initiate a signal converison by establishing a control pulse to gated switch 22 or switch 38 depending on the type of signal to be converted and establishing a control pulse to time delay means 52 which similar to FIG. 1 includes four time delay circuits 52*a*, 52*b*, 52*c* and 52*d*. Similar to FIG. 1 pulse $P_1$ is established by time delay circuit 52*a* a short time increment after operation of control circuit 50 to apply a control pulse to gated switch 28. Pulse $P_1$ is effective to set the output of counter 42*a* to 15 millivolts as discussed in connection with FIG. 1.

The system of FIG. 5 utilizes two memory circuits 62 and 64 for achieving control over the magnitude of the digital output increments. Pulse $P_1$ in addition to effecting the aforementioned functions is also applied through a diode 68 and a pair of diodes 70 and 72 to the memory circuits 62 and 64 to insure the same are turned off at the start of the signal conversion.

After a time increment sufficient for control pulse $P_1$ to effect the above described functions, pulse $P_2$ is established by time delay circuit 52*b* and applied to memory circuit 62 to activate the same. In response, memory circuit 62 functions to establish an output signal which is applied to gate 54 to effect application of the oscillator output pulses to the input of counter 42*b*. As a result the digital output signal will start to increase in 10 millivolt increments from the initial 15 millivolt magnitude thereof through the counting operation of counters 42*b*, 42*c* and 42*d*.

As long as the input signal $E_1$ exceeds the feedback signal $E_2$ the null detector 10 will produce a logic zero output causing pulse generating operation of oscillator 40. When the null condition is reached, null detector 10 functions to establish a logic one input to oscillator 40 to momentarily stop the generation of electrical pulses.

In the embodiment of FIG. 5 null detector 10 also functions at the null condition to establish a logic pulse which is conducted by diodes 70 and 72 respectively to memory circuits 62 and 64 to effect resetting of memory circuit 62 thereby terminating the output control pulse thereof to gate circuit 54.

Memory circuit 62 functions in response to the resetting pulse generated by null detector 10 to trigger time delay circuit 52*c*. After a predetermined time increment delay circuit 52*c* establishes pulse $P_3$ which is applied to counter 42*a* to clear the output thereof and thereby subtract a 15 millivolt increment from the digital output signal similar to the system of FIG. 1. A short time increment later pulse $P_4$ is established and utilized to activate memory 64. Memory 64 accordingly functions to apply a control pulse to gate circuit 56 to effect application of the oscillator pulses to the input of counter 42*a*.

The subtraction of the fifteen millivolt increment from the digital output signal causes the signal $E_1$ to again exceed the feedback signal $E_2$ and upon application of pulse $P_4$ to gate 56 the digital output signal will commence to increase in one millivolt increments until the feedback voltage $E_2$ again equals the input signal $E_1$. At this null condition the null detector 10 will establish a logic one input to oscillator 40 and establish a logic pulse input to memory 64 thereby resetting memory 64. Memory 64 functions in response to the resetting pulse to generate a read-out pulse which effects operation of read-out system 44.

The system illustrated in FIG. 5 thus also functions to initially set the digital output signal to 15 millivolts and to effect incrementation of the digital output signal by 10 millivolts in response to each oscillator pulse. However, as distinguished from the embodiments disclosed in FIGS. 1 and 4, the embodiment of FIG. 5 functions to increment the digital output signal by 10 millivolts only until the feedback signal $E_2$ initially equals or exceeds the input signal $E_1$. When this null condition first occurs the initial 15 millivolt increment is subtracted from the digital output signal. The system then functions to effect a 1 millivolt incrementation of the digital output signal in response to each oscillator pulse until the null condition again occurs.

While several embodiments of the invention have been herein shown and described, it will be apparent to those skilled in the art that many changes may be made in the construction and arrangement of parts without departing from the scope of the invention as defined in the appended claims.

It is claimed and desired to secure by Letters Patent of the United States:

1. An analog to digital signal converter for converting a varying analog input signal to a proportional digital signal comprising, an oscillator circuit for generating electrical pulses in response to an oscillator input, a counting circuit for establishing a digital output signal in response to said pulses, means for converting said digital output signal to a proportional analog feedback signal, means for incrementing the magnitude of said digital output signal by a predetermined amount in response to each of said pulses during a first period of variation of the analog input signal, means for incrementing the magnitude of said digital output signal by a different amount but in the same direction in response to each of said pulses during a second period of variation of the analog input signal, and a null detector for comparing the analog input signal with the feedback signal to establish said oscillator input when the analog input signal exceeds the feedback signal.

2. An analog to digital signal converter for converting to a proportional digital signal an analog input signal which increases exponentially from a predetermined initial value to a predetermined maximum value in a predetermined period of time comprising, an oscillator circuit for generating electrical pulses in response to the existence of an oscillator input, a counting circuit having a digital output signal adapted to be incremented by said pulses, a converter for converting said digital output signal to a proportional analog feedback signal, means for comparing said feedback signal and the analog input signal to establish an input to said oscillator to effect operation of said counting circuit until a null condition is achieved, means for incrementing the digital output signal of said counting circuit a predetermined amount in response to each of said pulses during an initial period of the predetermined time of increase of the analog input signal to be converted, and means for incrementing the digital output signal of said counting circuit by a lesser amount in response to each of said pulses during the remainder of the predetermined period of increase of the analog input signal to cause said digital output signal to substantially follow the analog input signal in magnitude.

3. An analog to digital signal converter for converting to a proportional digital signal an analog signal which increases from a predetermined initial value to a predetermined maximum value in a predetermined period of time comprising, an oscillator circuit for generating electrical pulses in response to an oscillator input, a counting circuit having a digital output signal adapted to be incremented by said pulses, a converter for converting said digital output signal to a proportional analog feedback signal, means for comparing the analog input signal with said feedback signal to establish a signal input to said oscillator to establish operation of said counting circuit until a null or zero signal difference condition is achieved, means for initially increasing the digital output signal of said counting circuit by a first increment, means operative during a first time period of increase of the analog input signal to effect increase of said digital output signal by a predetermined second increment in response to each of said pulses, means operative at the end of said first time period for subtracting said first increment from said digital output signal, and means operative during a second time period of increase of the analog input signal for increasing said digital output signal by a predetermined third increment in response to each of said pulses until said digital output signal equals the analog input signal.

4. An analog to digital signal converter for converting to a proportional digital signal an analog signal which increases from a predetermined initial value to a predetermined maximum value in a predetermined period of time comprising, an oscillator circuit for generating electrical pulses at a predetermined constant frequency in response to an oscillator input, counting means operative in response to said pulses and having a digital output signal, a converter for converting said digital output signal to a proportional analog feedback signal, means for comparing the analog input signal with said feedback signal to establish a signal input to said oscillator to establish operation of said counting means until a null condition is achieved, said counting means including a first counter effective when operative to increase said digital output signal by a first predetermined increment in response to each of said pulses, said counting means including a second counter effective when operative to increase said digital output signal by a second smaller predetermined increment in response to each of said pulses, means for applying said oscillator pulses to said first counter during a first time period of increase of the analog input signal to effect incremental increase of said digital output signal by operation of said first counter, and means for applying said oscillator pulses to said second counter during the remainder of the predetermined time period of increase of the analog input signal to effect incremental increase of said digital output signal by operation of said second counter circuit until the analog input signal reaches its maximum value and said digital output signal is equal thereto.

5. An analog to digital signal converter for converting to a proportional digital signal an analog signal which increases from a predetermined initial value to a predetermined maximum value in a predetermined period of time comprising, an oscillator circuit for generating electrical pulses at a predetermined constant frequency in response to an oscillator input, counting means operative in response to said pulses and having a digital output signal, a converter for converting said digital output signal to proportional analog feedback signal, means for comparing the analog input signal with said feedback signal to establish a signal input to said oscillator to establish operation of said counting means until a zero signal difference condition is achieved, said counting means including a first counter effective when operative to increase said digital output signal by a first predetermined increment in response to each of said pulses, said counting means including a second counter effective when operative to increase said digital output signal by a second smaller predetermined increment in response to each of said pulses, means for setting said digital output signal of said counting means to an initial magnitude, means for applying said oscillator pulses to said first counter during a first time period of increase of the analog input signal to effect incremental increase of said digital output signal from said initial magnitude thereof, means operative at the end of said first time period to subtract a digital increment equal to said initial magnitude from said digital output signal, and means for applying said oscillator pulses to said second counter during the remainder of the predetermined time period of increase of the analog input signal to effect increase of said digital output signal by operation of said second counter until the analog input signal reaches its maximum value and said digital output signal is equal thereto.

6. An analog to digital signal converter as claimed in claim 5 wherein said second predetermined increments are equal to one-tenth the magnitude of said first predetermined increments.

7. An analog to digital signal converter for converting to a proportional digital signal an analog signal which increases from a predetermined initial value to a predetermined maximum value in a predetermined period of time comprising, an oscillator circuit for generating electrical pulses at a predetermined constant frequency in response to an oscillator input, counting means operative in response to said pulses and having a digital output signal, a converter for converting said output signal to a proportional analog feedback signal, means for comparing the analog input signal with said feedback signal to establish an input to said oscillator to establish operation of said counting means until a zero signal difference condition is achieved, said counting means including a first counter effective when operative to increase said digital output signal by a first predetermined increment in response to each of said oscillator pulses, said counting means including a second counter effective when operative to increase said digital output signal by a second predetermined increment in response to each of said oscillator pulses, said counting means including a third counter effective when operative to increase said digital output signal by a third predetermined increment smaller in magnitude than said second increment in response to each of said oscillator pulses, means for initially setting the digital output signal of said counting means to a predetermined magnitude, means for applying said oscillator pulses to said first counter during a first time period of increase of said digital output signal by operation of said first counter, means for applying said oscillator pulses to said second counter during a second time period of increase of the analog input signal to effect incremental increase of said digital output signal by operation of said second counter, means operative at the end of said second time period for subtracting from said digital output signal an increment equal in magnitude to said initial magnitude of said digital output signal, and means for applying said oscillator pulses to said third counter during the remainder of the predetermined time period of increase of the analog input signal to effect incremental increase of said digital output signal by operation of said third counter until the analog input signal reaches its maximum value and said digital output signal is equal thereto.

8. An analog to digital signal converter as claimed in claim 7 wherein said third predetermined increment is one-tenth the magnitude of said second predetermined increment and said second predetermined increment is one-tenth the magnitude of said first predetermined increment.

9. An analog to digital signal converting device for converting an analog alternating signal to a proportional digital signal comprising, an electric oscillator for generating electrical pulses in response to an oscillator input, counting means responsive to electrical pulses for establishing a digital output signal, a converter for converting said digital output signal to a proportional analog D.-C. feedback signal, a comparison circuit for comparing the alternating analog signal with said feedback signal to establish an oscillator input during alternate half cycles when said feedback signal is smaller in magnitude than the instantaneous magnitude of the alternating analog signal, means for initially effecting a predetermined incremental increase of said digital output signal in response to each of said pulses during a first predetermined period of operation, and means for effecting a smaller predetermined incremental increase of said digital output signal in response to each of said pulses after the end of said predetermined period until said digital output signal equals the peak magnitude of the analog alternating input signal.

10. An analog to digital converter for converting an analog input signal to a proportional digital signal comprising, an oscillator circuit for generating electrical pulses, counting means responsive to said pulses for establishing a digital output signal, said counting means including a first counter for incrementing said digital output signal by a first predetermined amount in response to each oscillator pulse applied thereto, said counting means including a second counter for incrementing said digital output signal by a second smaller predetermined amount in response to each oscillator pulse applied thereto, means for converting said digital output signal to a proportional feedback signal, means for comparing said feedback signal with the analog input signal to establish a first logic signal when the analog input signal is larger in magnitude than said feedback signal and a second logic signal when said feedback signal is larger than or equal to the analog input signal, means for initially setting the digital output signal to a predetermined magnitude at the start of a signal conversion, means operative at the start of a signal conversion in response to said first logic signal to apply said oscillator pulses to said first counter, means responsive to the occurrence of said second logic signal for subtracting an increment from said digital output signal equal to the initial set magnitude of said digital output signal to effect re-occurrence of said first logic signal through operation of said comparing means, and means responsive to said re-occurrence of said first logic signal as a result of operation of the last said means for applying said oscillator pulses to said second counter.

11. An analog to digital converter for converting an analog input signal to a proportional digital signal comprising, an oscillator circuit for generating electrical pulses, counting means responsive to said pulses for establishing a digital output signal, said counting means including a first counter for incrementing said digital output signal by a first predetermined increment in response to each of said oscillator pulses applied thereto, said counting means including a second counter for incrementing said digital output signal by a second smaller predetermined increment in response to each of said oscillator pulses applied thereto, means for converting said digital output signal to a proportional feedback signal, means for comparing said feedback signal with the analog input signal to establish a first logic signal when the analog input signal is larger in magnitude than said feedback signal and a second logic signal when said feedback signal is equal to or greater in magnitude than the analog input signal, means operative at the start of a signal conversion in response to said first logic signal to apply said oscillator pulses to said first counter, means responsive to the occurrence of said second logic signal for subtracting a predetermined increment from said digital output signal to effect re-occurrence of said first logic signal, and means responsive to the re-occurrence of said first logic signal as a result of operation of the last said means for applying said oscillator pulses to said second counter.

12. An analog to digital converter for converting an analog input signal to a proportional digital signal comprising, an oscillator circuit operative in response to a logic signal for generating electrical pulses, counting means responsive to said pulses for establishing a digital output signal, said counting means including a first counter for incrementing said digital output signal by a first predetermined increment in response to each oscillator pulse, said counting means including a second counter for incrementing said digital output signal by a second smaller increment in response to each oscillator pulse, means for converting said digital output signal to a proportional feedback signal, means for comparing said feedback signal with the analog input signal to establish a first logic signal when the analog input signal is larger in magnitude then said feedback signal and a second logic signal when said feedback signal is equal to or greater than the analog input signal, said oscillator being operative in response to said first logic signal and inoperative in response to said second logic signal, means operative at the start of a signal conversion for applying said oscillator pulses to said first counter for a predetermined time, means operative at the end of said predetermined time for subtracting a predetermined increment from said digital output signal, means operative during a second subsequent predetermined period of time for applying said oscillator pulses to said second counter to read out said digital output signal.

References Cited by the Examiner

UNITED STATES PATENTS 3,072,846 1/63 Belcher ______________ 340—347

MALCOLM A. MORRISON, *Primary Examiner.*